United States Patent [19]

Ikezi et al.

[11] Patent Number: 4,564,807

[45] Date of Patent: Jan. 14, 1986

[54] METHOD OF JUDGING CARRIER LIFETIME IN SEMICONDUCTOR DEVICES

[75] Inventors: Hiroyuki Ikezi, San Diego; Richard L. Freeman, Del Mar, both of Calif.

[73] Assignee: GA Technologies Inc., San Diego, Calif.

[21] Appl. No.: 593,801

[22] Filed: Mar. 27, 1984

[51] Int. Cl.[4] .............................................. G01R 31/26
[52] U.S. Cl. .............................. 324/158 D; 324/158 R
[58] Field of Search ........... 324/158 D, 158 R, 158 T, 324/158 SC

[56] References Cited

U.S. PATENT DOCUMENTS

| | | | |
|---|---|---|---|
| 3,134,077 | 5/1964 | Hutchins | 330/2 |
| 3,443,227 | 5/1969 | Kelly et al. | 324/158 |
| 3,518,545 | 6/1970 | Copeland, III | 324/158 |
| 3,697,873 | 10/1972 | Mazur | 324/158 D |
| 3,731,192 | 5/1973 | Miller | 324/158 D |
| 3,939,415 | 2/1976 | Terasawa | 324/158 D |
| 4,010,418 | 3/1977 | Salvatore | 324/158 T |
| 4,090,132 | 5/1978 | Alexander | 324/158 D |
| 4,106,096 | 8/1978 | Paoli | 324/158 D |
| 4,286,215 | 8/1981 | Miller | 324/158 R |

FOREIGN PATENT DOCUMENTS

| | | | |
|---|---|---|---|
| 0616597 | 7/1978 | U.S.S.R. | 324/158 D |
| 748250 | 7/1980 | U.S.S.R. | |

OTHER PUBLICATIONS

*Solid State Electronics*, vol. 13, No. 3, pp. 394-395.
Ikezi, H. et al., "Observation of Multiple-Valued Attractors and Crises in a Driven Nonlinear Circuit", Phys. Rev. A, vol. 28, Aug. 1983, pp. 1207-1209.
Bilotti, A., "Measurement of the Effective Carrier Lifetime by a Distortion Technique", Solid State Electronics, vol. 10, 1967, pp. 445-448.

*Primary Examiner*—Stewart J. Levy
*Assistant Examiner*—Stephen M. Baker
*Attorney, Agent, or Firm*—Fitch, Even, Tabin & Flannery

[57] ABSTRACT

A method for judging whether a group of semiconductor devices have sufficiently short carrier lifetimes to make them suitable for use in high speed electronic circuitry. A determination is made as to the satisfactory carrier lifetime for a pn junction in the devices. A capacitance value representative of the pn junction, when reverse biased, is also determined. The pn junction is placed in series with an inductor sized so that the resonant frequency of the inductor and the pn junction, when reversely biased, is substantially equal to the reciprocal of the carrier lifetime. An oscillating voltage is applied to the series combination of the junction and the inductor, the voltage having a fundamental frequency near but above the resonant frequency and an amplitude greater than a predetermined level which is in the range of 3-5 volts. Finally, the device under test is rejected should an output taken across the pn junction show a substantial frequency component below the fundamental frequency.

10 Claims, 3 Drawing Figures

METHOD OF JUDGING CARRIER LIFETIME IN SEMICONDUCTOR DEVICES

BACKGROUND OF THE INVENTION

The present invention relates to a method of testing electronic components and, more particularly, to a method of judging carrier lifetime in semiconductor devices.

Semiconductor materials such as silicon and germanium have an atomic structure in which the outer or valence shell has four electrons. A completely filled valence shell has a total of eight electrons. Since the valence shell has exactly half the number of electrons of a filled valence shell, an atom of such semiconductor can enter into a crystalline latticework structure with four neighboring atoms. Due to covalent bonding, each of the four other atoms shares one of their valence shell electrons with the first atom to effectively fill the valence shell of the first atom. Likewise, the first atom shares one of its valence shell electrons with each of the four neighboring atoms. In a pure crystalline structure, each of the four other atoms similarly shares electrons so that theoretically the valence shell of each atom is filled due to covalent bonding.

Unlike conductors, which have many free electrons, and insulators, which have virtually no free electrons, pure semiconductor materials have a few free electrons, and the number of such electrons increases with temperature. This occurs because of the moderate gap energy needed for an electron in a semiconductor to jump from the valence shell to the conduction level where it is available to transport electron current. A valence electron in an insulator such as diamond requires a gap energy of 7 electron volts (eV) while a valence electron in a conductor such as tin needs only 0.1 eV. By contrast, the gap energy for silicon is 1.1 eV and for germanium is 0.72 eV.

At any temperature above absolute zero, there are a few naturally occurring thermally generated free (conduction level) electrons present in a semiconductor. When an electron, having accumulated sufficient energy, jumps from the valence shell, it leaves behind a hole and thus causes the atom which lost the electron to become a positively charged ion. It may happen that an electron from the conduction level moves to fill the hole in the atom thus causing the negative charge of the electron and the positive charge of the ion to cancel one another. This process is known as recombination.

An n type semiconductor has extra free electrons and is made by doping a pure intrinsic semiconductor crystal with donor impurities having atomic structures with five electrons in their valence shell. Commonly used pentavalent donors are phosphorous, arsenic, antimony and bismuth, and a semiconductor formed by doping is known as an extrinsic semiconductor. When a donor atom enters into covalent bonding with the four silicon or germanium atoms, a free electron is formed because there are nine electrons available for a valence shell which can hold a maximum of eight, and the donor impurity, having lost an electron, becomes a positively charged ion.

A p type semiconductor has an excess of holes and is formed by doping the pure semiconductor crystal with acceptor impurities having atomic structures with three electrons in their valence shell. Commonly used trivalent acceptors are boron, aluminum, gallium and indium. When an acceptor atom enters into covalent bonding with the four other atoms, a hole is formed because even with covalent bonding the acceptor atom has only seven electrons in its valence shell. However, if a free electron moves to fill the hole thus formed, the acceptor atom becomes a negatively charged ion.

When standing alone and in the absence of any electrical field, a p type semiconductor has an even distribution of holes and negatively charged acceptor ions. Similarly, under the same circumstances an n type semiconductor has an even distribution of free electrons and positively charged donor ions. However, when a p type region and an n type region are formed next to each other in the same semiconductor crystal, these even distributions are radically altered. In the vicinity of the boundary or junction formed between the p region and the n region, the holes and electrons diffuse toward one another and combine. This results in the formation of a depletion region including the pn junction. The term "depletion" is quite appropriate as this region is depleted of current carriers (holes or electrons).

The p side of the depletion region contains negative ions while the n side of the region contains positive ions. The ions in the depletion region cannot carry current because they cannot move since they are fixed in the covalent bonding of the crystal lattice. Since there are no carriers in the region capable of moving, the depletion region becomes a barrier to current flow. Holes in the p region are repulsed by the positive ions on the n side of the depletion region, and electrons in the n region are repulsed by the negative ions on the p side of the depletion region.

The width of the depletion region can be changed by the application of an external voltage to the pn junction. The junction can be forward-biased to reduce the width of the depletion region so that holes and electrons can pass through it, thus rendering the semiconductor conductive. On the other hand, reverse-biasing of the junction increases the width of the depletion region to preclude passage of substantial numbers of electrons and holes, thus causing the semiconductor device to function as an insulator.

Conduction in semiconductor material occurs not only because of the diffusion or charge motion from a region of higher density to a region of lower charge density. Additionally, conduction occurs because of the drift of holes or electrons under the influence of an applied potential. As mentioned above, there are naturally occurring thermally generated electron-hole pairs in intrinsic semiconductors and the same is true of extrinsic or doped semiconductors. In an n type semiconductor electrons are called the majority carriers since they predominate. However, in an n type semiconductor thermally generated carriers of the opposite type (holes) are also present in small quantities and are known as minority carriers. Of course, in a p type semiconductor, holes are the majority carrier and electrons are the minority carrier. The resistivity of the semiconductor is a function of the concentration of majority carriers.

Additional minority carriers can be injected into the semiconductor material by various means including applying an electrical pulse to the material or by illuminating the material with a short light pulse. These additional minority carriers, over and above the number of naturally occurring, thermally generated minority carriers, are known as excess minority carriers. With the passage of time, these excess minority carriers recombine with the majority carriers. Carrier lifetime is the average time required for excess minority carriers to recombine with the majorities and usual lifetimes are in the range of 1 to 1,000 microseconds. In some applications of semiconductor devices short carrier lifetime is desired because the carrier lifetime determines the turn-off time of the device. That is, excess or stored minority carrier densities must be depleted before a diode will cease to conduct after having been reversely biased. Judgment of carrier lifetime is a way of checking the performance of semiconductor devices at the production line of such devices.

One method of measuring minority carrier lifetime in semiconductor materials employs a noncontacting steady-state technique wherein a light source is switched on and off at a frequency which is low compared to the reciprocal of the longest acceptable carrier lifetime. The conductivity of the semiconductor is measured by contactless means both during periods of illumination and during periods of nonillumination. The difference in conductivity during the respective periods is proportional to the effective carrier lifetime. For a further description of this method and the apparatus used for implementing it, reference may be made to U.S. Pat. No. 4,286,215.

In another known method, the doping density profile or impurity distribution of a semiconductor wafer is measured. In this method, an oscillating voltage of frequency f is applied to a reverse-biased semiconductor diode, and the output alternating voltage derived from the diode is examined. This method is predicated on the discovery that if alternating current of frequency f is directed through a reverse-biased semiconductor diode, the amplitude of the output voltage at the fundamental frequency is proportional to the depth of the semiconductor depletion layer and that the amplitude of the voltage at the second harmonic frequency 2f will be proportional to the reciprocal of the doping density at the edge of the depletion layer. For a further description of this method and apparatus used in carrying it out, reference may be made to U.S. Pat. No. 3,518,545.

In still another known method, excess carrier lifetime is judged by measuring the slope of an open-circuit voltage decay curve taken across the device. In this method, rectangular current pulses are repetitively applied to the device to be tested. The slope of the decay curve is measured by observing the voltage across the device immediately following the termination of each current pulse. It will be appreciated that in this method, as in the previouslydiscussed methods, quantification is required. Accordingly, rather complex circuitry and equipment is required to carry out the method. See U.S. Pat. No. 4,090,132 for a further description of this method and the equipment required to implement it.

SUMMARY OF THE INVENTION

Among the several aspects of the present invention may be noted the provision of an improved method of judging carrier lifetime in semiconductor devices; the provision of such method which requires only simple circuitry and can be used in judging carrier lifetime in pn junctions in a variety of semiconductor devices; the provision of such method which avoids the use of illumination and which does not require changing the frequency of the applied voltage with each device; and the provision of such method which is simple and reliable in use because the method does not require quantification and is tantamount to a simply "go-no go" test. Other aspects and features of the present invention will be in part apparent and in part pointed out hereinafter in the specification, drawings and attendant claims.

Briefly, the method of the present invention comprises several steps. A determination of a satisfactory carrier lifetime for a pn junction in the semiconductor device to be tested is made and a capacitance value representative of the pn junction when reversely biased is determined. The pn junction of the device being tested is placed in series with an inductor sized so that the resonant frequency of the inductor and the pn junction, when reversely biased, is substantially equal to the reciprocal of the carrier lifetime. Applied to the series combination of the junction and the inductor is an oscillating voltage having a frequency near but above the resonant frequency, and an amplitude greater than a predetermined level. Finally, the device under test is rejected should an output taken across the pn junction show a frequency component below the fundamental frequency.

DESCRIPTION OF THE PREFERRED EMBODIMENT

Figure 1:
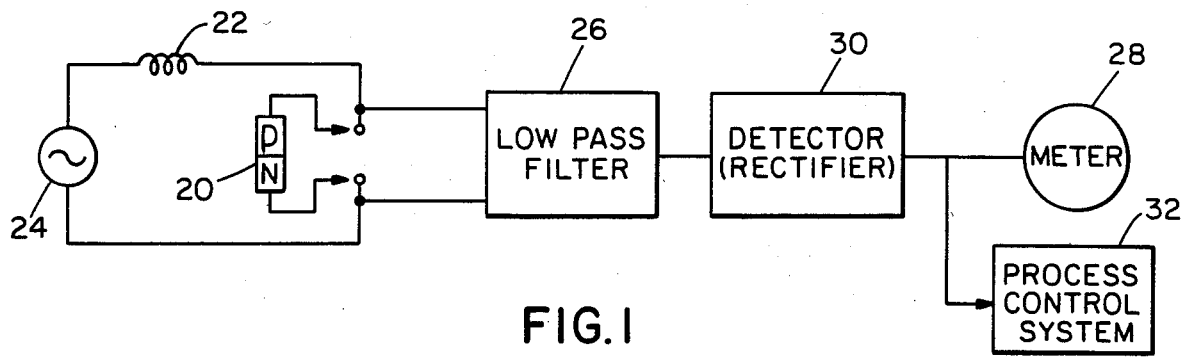
FIG. 1 is a diagram, partly schematic in nature, showing a pn junction of a diode connected in a circuit and illustrating, in block form, other components used in carrying out the method of the present invention for determining if the minority carrier lifetime of the device under test is unacceptably long.

Referring now to the drawings, FIG. 1 shows a circuit in which is connected a pn junction 20 of a semiconductor device to be tested. Also shown, in block form, are other electronic components for providing an output indicative of whether the device under test has an unacceptably long minority carrier lifetime. In an extrinsic semiconductor, the current-carrier type introduced by doping predominates. In an n type material these majority carriers are electrons whereas, they are holes in a p-type material. Minority carriers are also present in relatively small quantities. Carrier lifetime is the average time required for excess minority carriers to recombine with majority carriers. The carrier lifetime indicates the speed at which the junction can switch between conducting and non-conducting states. Carrier lifetime is thus an extremely important criteria in assessing whether a semiconductor device is suitable for use in a high speed electronic circuit. For example, in the case of a diode, the carrier lifetime determines how fast stored minority carrier densities can be depleted so that the diode will stop conducting in the reverse direction.

The test circuit shown in FIG. 1 is extremely simple as to componentry; its operation, however, requires some analysis. It comprises the series combination of an inductor 22 and the junction 20 (which functions as a diode) across a source 24 of oscillating voltage. It will be appreciated that the semiconductor junction, when reverse biased, operates as a capacitor. Thus, with the junction reverse biased, the inductor and junction form an L-section filter. When the capacitive reactance and the inductive reactance are equal, the circuit is in resonance. The frequency of the voltage source 24 is selected to be near but above the resonant frequency of the resonant circuit including the semiconductor device incorporated into the testing circuit. While the reverse biased junction acts as a capacitor, it does not act as one of very high quality. This is because the ratio of its reactance to its effective series resistance at the resonant frequency is low. Thus, the quality factor or Q of the circuit is low, about 2 or 3. A low quality factor results in reduced sharpness in the resonance curve. That is, the curve shows a wide bandwidth.

A low quality factor is usually to be avoided. However, in the method of the present invention for providing a simple "go-no go" production line test, the low quality factor may be used to great advantage. This is because there is some variation of the capacitance in any group of semiconductor devices to be tested. If the circuit had a high quality factor, the frequency of voltage source 24 would require readjustment with each separate device, and it would be necessary to measure the capacitance of each device in order to determine the proper resonance frequency. But with a low quality factor, the bandwidth of the resonance curve is sufficiently broad to accommodate the range of capacitances of the devices. Thus, the capacitance of each separate device does not need to be determined, and the frequency of the voltage source does not require adjustment with each device in order to carry out testing of production run devices.

Figure 2:
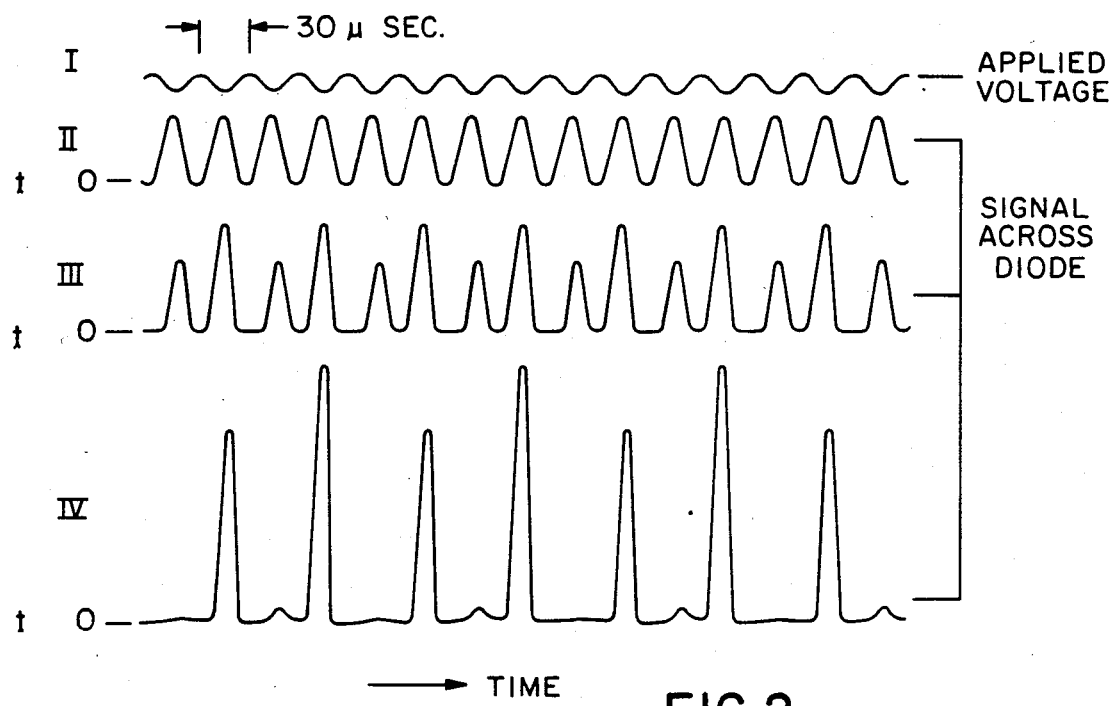
FIG. 2 is a series of voltage plots, showing the applied voltage and outputs across the pn junction of a device having an unacceptably long carrier lifetime, at various amplitudes of the applied voltage.

Referring to FIG. 2, a non-linear phenomenon has been observed with an increase in the magnitude of the oscillating voltage at a frequency slightly above resonant frequency, when applied to the circuit of FIG. 1 having a pn junction with unacceptably high carrier lifetime. The top trace I shows the applied voltage. The next trace II depicts the output across the junction 20 when the magnitude of the applied voltage is below a threshold level, which typically is in the range of 3 to 5 volts. This trace II shows that the output voltage has a waveform of rectified half cycle pulses, all having a common pulse height. The third trace III illustrates the effect of increasing the magnitude of the applied voltage above the threshold or critical level. Now the pulse heights start showing a repetition of high and low, accordingly the fundamental frequency of the output detected across the junction is halved. For example, when the applied voltage was below the critical level, the frequency of the pulses was 30 KHz. However, after the magnitude of the applied voltage is increased above the critical level, the frequency of appearance of a high pulse is 15 KHz.

The lowest trace IV of FIG. 2 highlights the results of a further increase in the amplitude of the applied voltage on the output of the circuit across the pn junction. When the applied voltage reaches about 10 volts, 4 different pulse heights appear and the fundamental frequency of the output is again halved. This phenomenon continues with increased amplitude of the applied voltage until at a certain high level, about twenty volts for the example, the output signal becomes aperiodic. That is, the pulse height distribution becomes chaotic.

Figure 3:
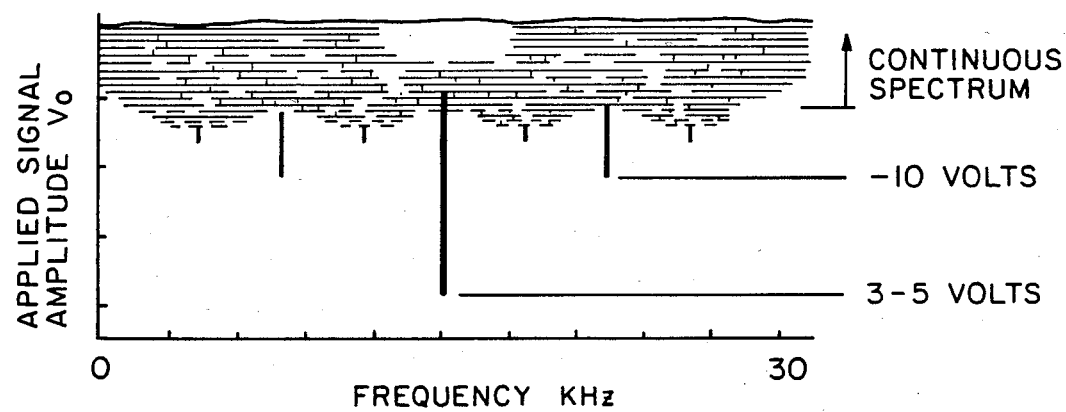
FIG. 3 is a graph illustrating the frequency spectrum of the output signal across the pn junction of a semiconductor device having an unacceptably long minority carrier lifetime.

The frequency spectrum of the output signal is shown in FIG. 3. Such a frequency spectrum can be determined using a frequency analyizer, as is well known to those skilled in the art. In this graph, the abscissa is a scale of the frequency of the output signal across the pn junction while the ordinate is a scale of the amplitude of the applied voltage provided by source 24. The width and intensity of the lines indicate the strength of the signal. When the applied voltage is below the critical level, only at 30 KHz does a vertical line appear, and that line indicates high signal strength. With the applied signal increasing above this level, the half frequency component appears at 15 KHz. If the applied voltage reaches about 10 volts, the quarter frequency components appear at 7.5 and 22.5 KHz. And at higher levels of the applied voltage the frequency spectrum becomes chaotic.

It is important to recognize that this phenomenon occurs only when the carrier lifetime of the device is longer than the reciprocal of the fundamental frequency of the output signal (which is also the frequency of the applied voltage) when the level of the applied voltage is below the critical level. Thus, if the applied voltage level is above the critical level, for example, in the range of 10 to 20 volts, and a signal is observed below the frequency of the applied voltage, then the carrier lifetime is greater than the reciprocal of this frequency. If no signal appears below this frequency, then the carrier lifetime is acceptably short for a fast switching semiconductor device. Thus for a pn junction with acceptably short carrier lifetime, the signal across the diode would continue to have the shape of trace II in FIG. 2 even after the applied voltage level exceeds the critical level. In order to assess if the pn junction has even shorter carrier lifetime, a smaller inductor can be used so that the resonant frequency is increased.

This method of judging carrier lifetime is particularly useful for assembly line testing of semiconductor devices because the method is very simple to implement and no independent exercise of operator judgment is required. Referring back to FIG. 1, a low pass filter 26, designed to eliminate signal components at the fundamental frequency of the applied voltage and above, is connected across the pn junction 20. The output of the filter can be detected by a meter 28 connected to the filter through a rectifier 30. While the filter output may have a small constant noise component, this component is subject to simple compensation by zeroing the meter or adjusting the equipment. The level of the noise signal is of much smaller magnitude than the filter output component resulting from the appearance of the half frequency component in the output of the pn junction. Alternatively, the output of the rectifier can be fed to automated process control equipment 32 adapted to reject a device under test should a signal component appear below the applied voltage frequency.

An example of the operation of the method of the present invention is as follows: A group of power diodes for use in 60 Hz rectification is to be tested. Such diodes have a carrier lifetime in the range of 35 to 500 microseconds. The application for the power diodes require that they have a carrier lifetime no greater than 50 microseconds. The representative capacitance of a reversely biased diode has been determined, for example, using a capacitance bridge, and it has been computed that a 7 millihenry ferrite core inductor should be used to provide a resonant frequency in the range of 10 to 30 KHz, the quality factor of the circuit being about 3. The power supply oscillator 24 fundamental frequency is 30 KHz, and its amplitude is set at 10 volts. If the meter registers a signal having a strength over that corresponding to the noise component of the filter, the device under test has an unacceptably long carrier lifetime and is rejected.

It will thus be appreciated that this test method is simple in use and requires relatively few components to implement. It will be further recognized that a different group of semiconductor devices can be set up for very quickly because all that is required to change the acceptance criteria is a change in the inductor and in the frequency of the applied voltage. While the test method has been described relating to diodes, the method has application in the testing of other semiconductor devices such as silicon control rectifiers and transistors. It is useful for testing a variety of semiconductor devices having pn junctions.

Further information relating to the attractor of the chaos in a driven nonlinear dissipative circuit is set forth in an article entitled "Observation of Multiple-Valued Attractors and Crises in a Driven Nonlinear Circuit" by Ikezi et al., Phys. Rev. A 28, Aug. 1983, pp. 1207-1209.

In view of the above, it will be seen that the several objects of the invention are achieved and other advantageous results attained.

As various changes could be made without departing from the scope of the invention, it is intended that all matter contained in the above description shall be interpreted as illustrative and not in a limiting sense.

What is claimed is:

1. A method for judging whether pn junctions in members of a group of semiconductor devices have carrier lifetimes greater than a maximum satisfactory carrier lifetime, the capacitance of a reverse-biased pn junction being known, said method comprising:
   (a) placing a pn junction in series with an inductor sized so that the resonant frequency of the inductor and the pn junction, when reverse-biased, is substantially equal to the reciprocal of said maximum satisfactory carrier lifetime;
   (b) applying to the series combination of said junction and said inductor an oscillating voltage having a fundamental frequency near but above said resonant frequency and an amplitude greater than a predetermined level; and
   (c) failing the device under test should an output taken across said pn junction show a substantial component at half said fundamental frequency.

2. A method as set forth in claim 1 further comprising the step of using a low pass filter to eliminate frequency components at and above said fundamental frequency, said filter having an input and an output with said input being connected across said pn junction.

3. A method as set forth in claim 2 further comprising the step of using a meter connected to said filter through a rectifier in making the decision whether to fail the device under test.

4. A method as set forth in claim 2 wherein automated process control equipment is connected to receive the output of said filter.

5. A method as set forth in claim 1 wherein said predetermined level is within the range of 3-5 volts.

6. A method for judging carrier lifetime in a pn junction of a semiconductor device comprising the steps of:
   (a) determining the capacitance of a reversely biased pn junction in a semiconductor which is representative of semiconductors in a group of semiconductors to be tested;
   (b) determining the resonant frequency of the series combination of an inductor and a pn junction of the device to be tested;
   (c) applying an oscillating voltage to said series combination, the frequency of said voltage being near said resonant frequency;
   (d) increasing the amplitude of said voltage from a predetermined level; and
   (e) detecting if the waveform appearing across the pn junction of the device under test exhibits a repetition of high and low pulse heights as the amplitude of said voltage is increased.

7. A method as set forth in claim 6 wherein the frequency of said voltage is slightly above said resonant frequency.

8. A method as set forth in claim 6 wherein said predetermined level is in the range of 3-5 volts.

9. A method for judging carrier lifetime in a pn junction of a semiconductor device comprising the steps of:
   (a) determining the capacitance of a reversely biased pn junction in a semiconductor which is representative of semiconductors in a group of semiconductors to be tested;
   (b) coupling an oscillator to the series combination of an inductor and a pn junction of the device to be tested;
   (c) causing said oscillator to apply a voltage the frequency of which is slightly above the resonant frequency of said series combination and which has an amplitude above a predetermined level; and
   (d) detecting if the waveform appearing across said pn junction has a substantial component below the fundamental frequency component.

10. A method as set forth in claim 9 wherein said predetermined level is in the range of 3-5 volts.

* * * * *